United States Patent [19]
Lee

[11] Patent Number: 6,107,791
[45] Date of Patent: Aug. 22, 2000

[54] NON-DISTURBING ELECTRIC FIELD SENSOR USING PIEZOELECTRIC AND CONVERSE PIEZOELECTRIC RESONANCES

[75] Inventor: Soon Chil Lee, Taejon, Rep. of Korea

[73] Assignee: Korea Advanced Institute of Science and Technology, Taejon, Rep. of Korea

[21] Appl. No.: 09/108,424

[22] Filed: Jun. 30, 1998

[30] Foreign Application Priority Data

Jul. 25, 1997 [KR] Rep. of Korea ....................... 97-34824

[51] Int. Cl.⁷ ................................................... G01R 31/00
[52] U.S. Cl. .......................................... 324/72.5; 324/727
[58] Field of Search ................................... 324/72.5, 109, 324/149, 228, 727; 310/311, 314, 317, 318, 357, 361, 367, 369; 367/155, 157, 165; 73/652

[56] References Cited

U.S. PATENT DOCUMENTS 4,620,446  11/1986  Jensen et al. ............................ 73/652

OTHER PUBLICATIONS

D. Lee et al., "Electric–field measurement near a ring antenna by new field sensor using piezoelectric resonance", Rev. Sci. Instrum. 67 (9), Sep. 1996, pp. 3320–3324.

*Primary Examiner*—Glenn W. Brown
*Assistant Examiner*—Vincent Q. Nguyen
*Attorney, Agent, or Firm*—Oliff & Berridge, PLC

[57] ABSTRACT

This invention relates to an electric field sensor for near field measurement. The electric field sensor of the present invention uses both piezoelectric and converse piezoelectric resonances. Composed of no metallic parts, the probe of the sensor minimizes field disturbance. The most distinguished feature of this probe is that a signal is transmitted outside neither electrically nor optically, but mechanically.

2 Claims, 2 Drawing Sheets

NON-DISTURBING ELECTRIC FIELD SENSOR USING PIEZOELECTRIC AND CONVERSE PIEZOELECTRIC RESONANCES

BACKGROUND OF THE INVENTION

1. Field of the Invention

The present invention relates to an electric field sensor, more particularly to a non-disturbing electric field sensor capable of measuring electric field without field disturbance.

2. Description of the Prior Art

The most widely used probe to measure electric field in plasma is a magnetic dipole probe that detects only induced field but not capacitive field. Electric dipole probe can measure capacitive field as well as inductive, out both magnetic and electric dipole probes have a serious drawback as a near field sensor, that is, they disturb the field to be measured because they contain metallic parts.

Most of the field disturbance of electric field sensors comes from the conducting parts of probes and the transmission line connecting the probe to monitoring instruments. To reduce the field disturbance coming from a probe, several electro-optic sensors and measuring techniques have been developed to replace the traditional pure electrical sensors, for example, magnetic or electric dipole sensors. Resistive lines or optical fibers are used in place of coaxial cables to reduce the field disturbance originating from the transmission line for pure electrical sensors or electro-optic sensors, respectively. One of the most widely studied optical techniques is to form a Mach-Zehnder interferometer where the arms are made of electo-optic modulators or bonded to an electrostrictive ceramic.

An oscillating electric field generates an oscillating strain in an electrostrictive ceramic and this strain induces an oscillating polarization. Both the strain and polarization oscillations can be used to measure external electric field, and the former is used in the Mach-Zehnder interferometer. The polarization-sensitive electrostrictive sensors are better than the electro-optic sensors including the strain-sensitive electrostrictive sensor in the sense that the conversion process from the optical to electrical signals is not necessary, but usually electrical transmission lines should be connected. To remove the field disturbance due to this electrical transmission lines, a method to detect the electromagnetic field owing to the polarization oscillation was suggested in the following reference: "Electric field measurement near a ring antenna by a new field sensor using piezoelectric resonance", Rev. Sci. Instrum., Vol. 67, P3320, 1996. Though no conducting parts are used in the probe of this sensor, its application is limited to pulsed fields and the absolute amplitude of electric field can not be given.

SUMMARY OF THE INVENTION

Therefore, it is an object of the present invention to provide an electric field sensor which can measure the absolute amplitude and direction of continuous radio frequency("rf") fields using both the strain and polarization oscillations in piezoelectrics.

It is another object of the present invention to provide an electric field sensor capable of measuring the electric field with minimum field disturbance.

It is yet another object of the present invention to provide an electric field sensor more resistant to temperature variation than conventional electro-optic sensors.

In order to accomplish the aforementioned objects, the present invention provides an electric field sensor, comprising: a vibration generating means for generating mechanical vibration induced by oscillating electric field, the vibration generating means having no field disturbing parts; a signal generating means placed far away from the electric field to prevent field disturbance, the signal generating means generating signals proportional to the mechanical vibration; and a transmitting means for transmitting the mechanical vibration to the signal generating means.

Oscillating strain generated in a first quartz disk by oscillating electric field by the converse piezoelectric effect is transmitted through a quartz rod to a second quartz disk at the other end of the rod. The strain oscillation in this second quartz disk generates polarization oscillation by the piezoelectric effect, which can be detected by the voltage difference between the electrodes on the disk.

Composed of no metallic parts, this probe minimizes field disturbance. This electromechanical sensor is as good as metal free electro-optic sensors in isolation and field disturbance. Since AT-cut quartz of which the temperature coefficient is zero near room temperature were used to make the probe, this sensor is more resistant to temperature variation than most electro-optic sensors. Moreover, the structure of this sensor is much simpler than that of most other sensors. Therefore, this sensor is best applicable to the measurement of electric field in plasma.

BRIEF DESCRIPTION OF THE DRAWINGS

The detailed description particularly refers to the accompanying drawings in which.

DETAILED DESCRIPTION OF THE PREFERRED EMBODIMENTS

Hereinafter, preferred embodiments of the present invention will be described referring to the accompanying drawings.

Figure 1:
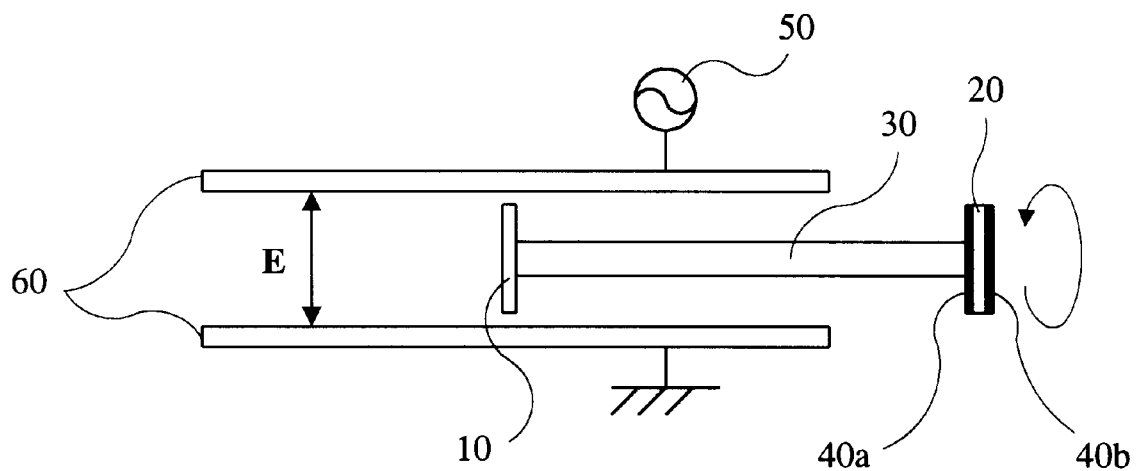
FIG. 1 is a schematic view showing the probe of the electric field sensor according to an embodiment of the present invention.

FIG. 1 is a schematic view showing the probe of the electric field sensor according to an embodiment of the present invention. Referring to FIG. 1, the probe has a simple structure that a first electrodeless quartz disk 10 is attached to one end of a quartz rod 30 and a second quartz disk 20 to the opposite end of quartz rod 30. The first quartz disk 10 is placed at a position to measure electric field E. Then, the strain oscillation excited by the converse piezoelectric effect in the first quartz disk 10 is mechanically transmitted through quartz rod 30 to the second quartz disk 20 at the opposite end which is placed far away from the region of interest not to disturb the electric field. Two electrodes 40a and 40b are attached to both ends of the second quartz disk 20. In the second quartz disk 20, the strain oscillation generates the polarization oscillation by the piezoelectric effect that is detected by the voltage difference between electrodes 40a and 40b. The strain oscillation in the first quartz disk 10 is proportional to the electric field component along the polarization direction of the disk 10, and the voltage difference generated on the second quartz disk 20 is linearly proportional to the transmitted mechanical vibration. So the signal in the second disk 20 is linearly proportional to the electric field at the first disk 10.

The quartz disks 10 and 20 having the resonance frequency same with a rf field frequency are used to construct the probe because the amplitudes of the mechanical and polarization oscillations are made strongest by exciting the quartzes at their own resonance frequency. Therefore, this is not a wide band sensor, however, it is not a practically big problem because users can use the same factory manufactured resonator that is used for the generation of the rf field of our interest as a probe in each application.

Quartz rod 30 with length of 30 cm and diameter of 4 mm was used as a mechanical vibration transmission media because of its high efficiency in transmission. The ends of the quartz rod 30 were polished before quartz disks 10 and 20 were bonded by epoxy. Quartz disks 10 and 20 are AT-cut quartzes with diameter of 8.5 mm and thickness of 0.5 mm which are obtained from commercially available oscillators. To prepare the first quartz disk 10, the electrodes and leads were eliminated by strong acid($HCl+HNO_3$). The probe constructed in this way has good linearity and field sensitivity of about 0.1V/cm that is good enough to measure electric field distribution in most plasma.

On the other hand, as shown in FIG. 1, AC power 50 is applied to parallel plates 60 to show the field to be measured is a continuous rf electric field.

Figure 2:
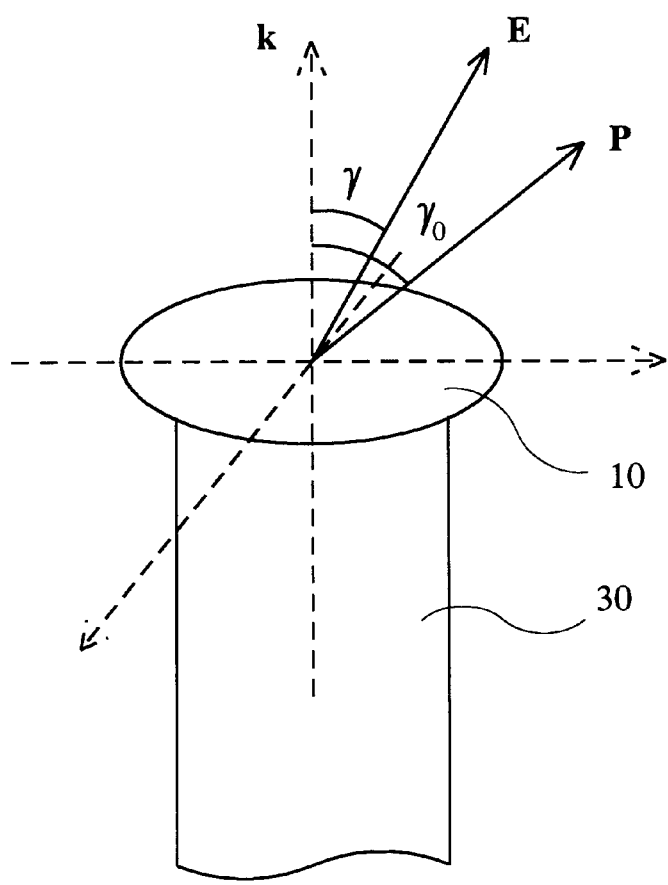
FIG. 2 is an explanatory view for obtaining the amplitude and direction of electric field.

FIG. 2 is an explanatory view for obtaining the amplitude and direction of electric field. The polarization direction of an AT-cut quartz disk is neither parallel with nor orthogonal to its axis. To measure electric fields with the probe, first the maximum signal $S_1$ should be found and measured while rotating the probe, and then the signal $S_2$ is measured after the probe is rotated 180° about the probe axis k. Since the polarization is proportional to the electric field component along the polarization direction, the relations between electric field E and these signals are given by:

$$S_1 = \alpha E \cos(\gamma - \gamma_0)$$

$$S_2 = \alpha E \cos(\gamma + \gamma_0)$$

where $\gamma_0$ and $\gamma$ are the angles between the probe axis k and the polarization direction and electric field, respectively, and $\alpha$ is a constant which can be determined by calibration. From the above equations, the direction and amplitude of electric field can be obtained if the polarization direction is known.

Referring FIG. 1 again, the method determining the polarization direction P of quartz disk and measuring the dependence of signals on the direction and intensity of the electric field will be described. A pair of two conducting rectangular parallel plates 60 which generate an homogeneous field E normal to its plates near its center were used to find the polarization direction of the first electrodeless quartz disk 10, and to test the signal dependence on the direction and amplitude of the external field. When the probe is located at the center with the probe axis parallel with the plates 60 as shown in FIG. 1, the direction of the polarization component projected to the first quartz disk plane can be found by observing the signal amplitude while rotating the probe about its axis. The signal is expected to be proportional to $|\cos \Phi|$ theoretically, where $\Phi$ is the angle between the direction of the projected component of the polarization and the direction normal to the plates or electric field direction.

Figure 3A:
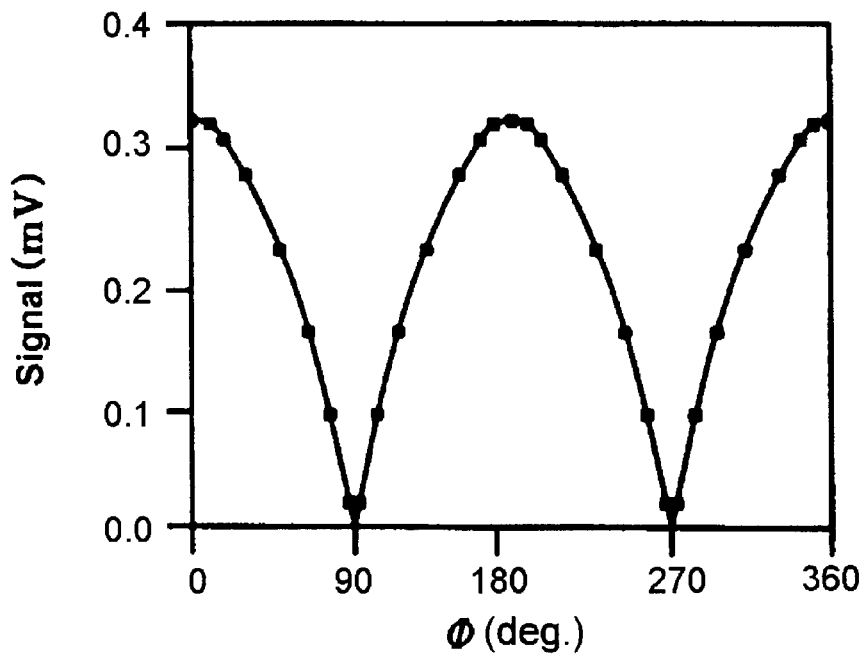
FIG. 3A is a graph showing a plot of the signal intensity (■) and $|\cos \Phi|$ as a function of $\Phi$ when the electric field intensity is 10V/cm.

FIG. 3A shows the experimental signal amplitude(■) as a function of the angle $\Phi$ with the $|\cos \Phi|$ curve, when the electric field intensity is 10V/cm. The solid line is the $|\cos \Phi|$ curve. The direction of the projected component of the polarization is parallel or antiparallel to the field direction when the observed signal is maximum and perpendicular when minimum. The agreement between theory and experiment is pretty good. The angle $\gamma_0$ between the polarization direction and the probe axis k can be found by comparing the maximum signal amplitude in FIG. 4A with the signal amplitude obtained by locating the probe at the same place but with its axis perpendicular to the plates 60.

Figure 3B:
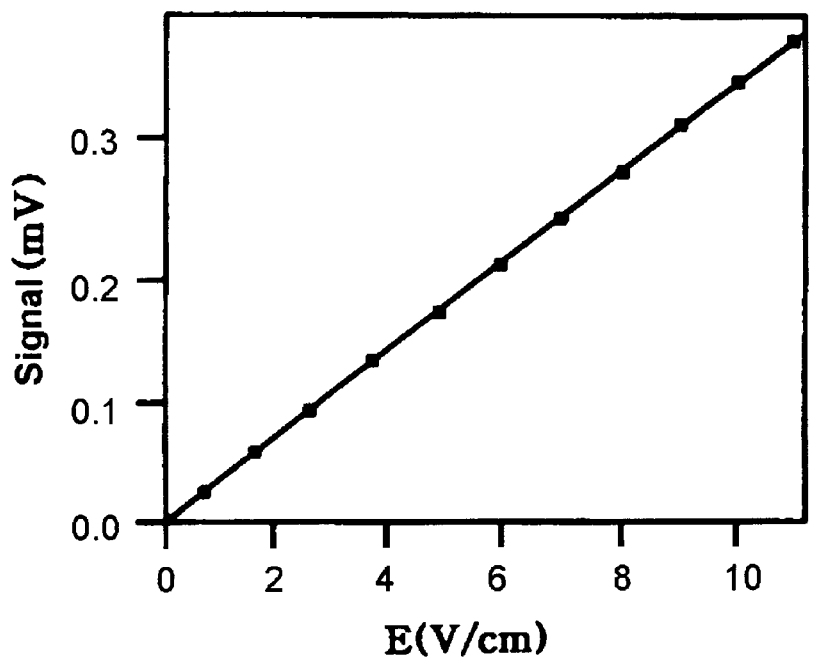
FIG. 3B is a graph showing the relation between the electric field intensity and signal intensity when $\Phi=0$.

FIG. 3B is the plot of the signal amplitude versus the electric field amplitude obtained at $\Phi=0$. FIG. 3B clearly shows that the relation between the signal amplitude and electric field amplitude is very linear in the experimental range. The results of the above two tests imply that the signal is proportional to E·P and convince us that this probe can detect the direction and magnitude of electric fields accurately.

What is claimed is:

1. An electric field sensor, comprising:

a first quartz disk for generating mechanical vibration induced by oscillating electric field and having a characteristic frequency same with the frequency of the electric field;

a second quartz disk for generating signals proportional to the mechanical vibration and having a characteristic frequency equal to the frequency of the electric field, both ends of the second quartz disk having electrodes; and a quartz rod with its one end attached to one end of the first quartz disk and its other end attached to one electrode of the second quartz disk for transmitting the mechanical vibration from the first quartz disk to the second quartz disk.

2. The electric field sensor of claim 1, wherein the first quartz disk is AT-cut and the temperature coefficient of the first quartz disk is zero near room temperature.

\* \* \* \* \*